(12) United States Patent
Lin et al.

(10) Patent No.: US 8,030,650 B2
(45) Date of Patent: Oct. 4, 2011

(54) PIXEL STRUCTURE AND METHODS FOR FABRICATING, DETECTING, AND REPAIRING THE PIXEL STRUCTURE

(75) Inventors: Yu-Hsin Lin, Hsinchu County (TW); Chung-Chih Cheng, Taoyuan County (TW)

(73) Assignee: AU Optronics Corp., Hsinchu (TW)

( * ) Notice: Subject to any disclaimer, the term of this patent is extended or adjusted under 35 U.S.C. 154(b) by 956 days.

(21) Appl. No.: 11/698,120

(22) Filed: Jan. 26, 2007

(65) Prior Publication Data

US 2007/0177053 A1 Aug. 2, 2007

(30) Foreign Application Priority Data

Jan. 27, 2006 (TW) .............................. 95103625 A

(51) Int. Cl.
*H01L 23/58* (2006.01)
(52) U.S. Cl. ................. 257/48; 257/59; 257/618; 438/4; 438/14; 438/34; 438/38; 324/770; 349/192
(58) Field of Classification Search .......................... None
See application file for complete search history.

(56) References Cited

U.S. PATENT DOCUMENTS

| | | | | |
|---|---|---|---|---|
| 5,691,786 A * | 11/1997 | Nakai | ............................. | 349/39 |
| 6,490,019 B2 * | 12/2002 | Lee et al. | ...................... | 349/113 |
| 6,628,368 B2 * | 9/2003 | Yang | ............................. | 349/192 |
| 6,664,568 B2 * | 12/2003 | Lai | ................... | 257/59 |
| 6,958,788 B2 * | 10/2005 | Choi et al. | ...................... | 349/43 |
| 6,969,643 B2 * | 11/2005 | Kim | ................... | 438/149 |
| 7,253,851 B2 * | 8/2007 | Lee et al. | ...................... | 349/55 |
| 2003/0016322 A1 * | 1/2003 | Ha et al. | ......................... | 349/113 |
| 2003/0044720 A1 * | 3/2003 | Lai | ................... | 430/311 |
| 2004/0079946 A1 | 4/2004 | Yang | | |
| 2004/0201803 A1 * | 10/2004 | Yang et al. | ...................... | 349/114 |
| 2004/0246433 A1 * | 12/2004 | Chen | ............................. | 349/192 |
| 2005/0225691 A1 * | 10/2005 | Yi et al. | ........................... | 349/44 |
| 2005/0259190 A1 * | 11/2005 | Wang et al. | ...................... | 349/38 |
| 2006/0012728 A1 * | 1/2006 | Watamura | ....................... | 349/43 |
| 2006/0028592 A1 * | 2/2006 | Lai | ................... | 349/42 |
| 2006/0232722 A1 * | 10/2006 | Huang et al. | .................... | 349/54 |

FOREIGN PATENT DOCUMENTS

| TW | 595250 | 6/2004 |
|---|---|---|
| TW | I228313 | 2/2005 |

* cited by examiner

*Primary Examiner* — Evan Pert
*Assistant Examiner* — Andres Munoz
(74) *Attorney, Agent, or Firm* — Birch, Stewart, Kolasch & Birch, LLP

(57) ABSTRACT

A pixel structure comprises at least two scan and data lines. The scan and data lines substantially intersects one another to form at least one region therein. The pixel structure further comprises at least one thin film transistor, at least one passivation layer, at least one defect detection pattern, and at least one pixel electrode. The pixel electrode is disposed on the passivation layer and electrically connected to the thin film transistor via an opening of the passivation layer. The defect detection pattern is disposed in the region to detect whether any residue remains therebelow.

28 Claims, 12 Drawing Sheets

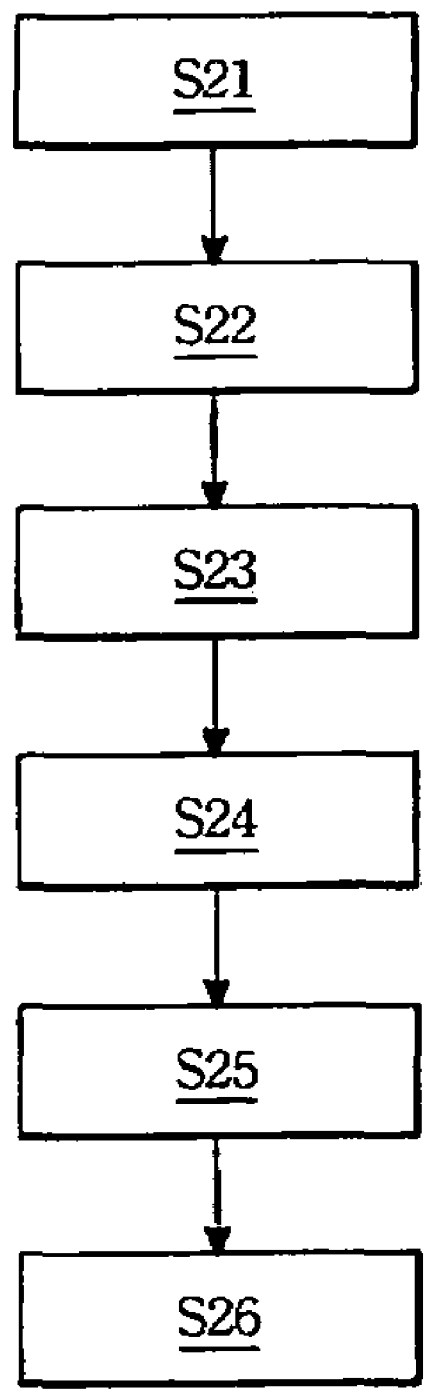
F I G . 8

PIXEL STRUCTURE AND METHODS FOR FABRICATING, DETECTING, AND REPAIRING THE PIXEL STRUCTURE

BACKGROUND OF THE INVENTION (1) Field of the Invention

The present invention relates to a pixel structure and, more particularly, to a structure which can facilitate to detect if there exists any residue.

(2) Description of the Prior Art

In general, a liquid crystal panel mainly comprises a light filter substrate, an array substrate, and a liquid crystal material layer filled between the light filter substrate and the array substrate. By controlling the electric field occurred between the array substrate and the light filter substrate, the direction of liquid crystal molecules of the liquid crystal layer can be twisted to change the path of light transmitting in the liquid crystal panel. Thereby, each of the light beams transmitting out the filter substrate can present particular brightness and thus a respective image corresponding to the incident light control can be displayed.

FIG. 1 shows a schematic top-view of an array substrate 1 in the liquid crystal display.

The array substrate 1 has a plurality of scan lines 10 and data lines 11. The scan lines 10 and data lines 11 are substantially interlaced with each other. Upon such an arrangement, the array substrate 1 is divided into a plurality of pixel structures 12, each of the pixel structures 12 has a thin film transistor 121 and a pixel electrode 122. Wherein, the thin film transistor 121 is a three-terminal switch electrically connected to the scan line 10, the data line 11, and the pixel electrode 122. The thin film transistor 121 can be turned on or turned off according to the input electric signals form the scan lines 10, and thereby to control the voltage signal transmitted from the data line 11 to the pixel electrode 122.

Besides, the scan lines 10, the data lines 11, the thin film transistor 121, and the pixel electrode 122 are all fabricated through respective depositing processes and etching processes so as to have various materials formed on the array substrate 1 in sequence by predetermined patterns. During the fabrication processes, residues may still remain outside the predetermined patterns, and thereby may lead to various defects.

For instance, FIG. 2 shows a schematic top-view of a pixel structure 12. Wherein the thin film transistor 121 is fabricated, an amorphous silicon material is disposed on a gate 1211 acting as a channel layer 1212 of the transistor 121. If the amorphous silicon material is not disposed in the predetermined position, the possible residues 13 would be formed to remain in the pixel structure as shown in FIG. 2. Else, the external materials may also be dropped onto the pixel structure and cause the residue 13.

If the residue 13 were located at an overlap region of the data line and the pixel electrode 122, a coupled capacitance will be generated between the residue 13 and the pixel electrode 122 located on the residue 13. While the array substrate 11 is operated and a voltage level is applied to the scan line 10 and the data line 11, the voltage of the data line 11 can cross the residue 13 so as to have the pixel electrode 122 to generate a coupled capacitance to affect common operation of the pixel electrode 122, and thereby a possible point defect can be introduced.

In FIG. 3, a schematic top-view of another pixel structure is shown. When a metal layer is deposited on the array substrate to form a plurality of the scan lines 10, and when a metal material is disposed outside the predetermined position, a residue 13 in the pixel structure would be formed, as shown in FIG. 3. If the residue 13 just happens to connect two scan lines 10, a short circuit leading to a line defect would be inevitable.

Accordingly, the above-mentioned residue 13 can become one of major reasons that cause defects on a liquid crystal panel. The currently testing method is to input a voltage across the scan lines and the data lines, to measure the voltage of each of the pixel electrodes, and then to compare if there exists any abnormal voltage at any one of the pixel electrodes. However, this testing exists a major drawback. In the above-mentioned pixel structure, a coupled capacitance circumstance is not enough to affect the voltage of the pixel electrode. Namely, it is difficult to sensitively detect the difference of voltages between the pixel electrodes with the coupled capacitance and those without the coupled capacitance. Thus, it is unable to identify whether or not the pixel structure contains an unnecessary residue, which causes the coupled capacitance.

If the residue remains in the pixel structure, a short circuit would exist between two adjacent scan lines. After a voltage is fed into the scan lines and the data lines of the device that meets a short circuit, all the response voltages measured at the pixel electrodes connected to the scan lines would become abnormal. However, the difference of the response voltages at the pixel electrodes would be extremely small. In other words, even that the short circuit between two adjacent scan lines can be located, it is still difficult to verify which pixel electrode has the residue causing the short circuit.

Hence, for the ordinary skilled people in the art, how to effectively detect the unnecessary residues on array substrates so as to prevent from the defect problems resulted from the residues is one of the main topics in the industrial circles.

SUMMARY OF THE INVENTION

Accordingly, it is an aspect of the present invention to provide a pixel structure that can easily detect whether or not a residue exists and at where the possible residue is disposed.

The pixel structure of the present invention includes at least two scan lines and at least two data lines. These scan lines and these data lines are substantially intersected by each other so as to form at least one region.

In addition, the pixel structure of the present invention comprises at least one thin film transistor, at least one passivation layer, at least one defect detection pattern, and at least one pixel electrode.

The thin film transistor (TFT) is disposed in the region and electrically connected to one of the two scan lines and one of the two data lines.

At least one passivation layer is disposed on the array substrate to cover the scan lines, the data lines, and the thin film transistor, and has at least one opening therein.

At least one defect detection pattern is disposed in the region for detecting whether or not a residue exists therebelow.

At least one pixel electrode is disposed on the passivation layer and electrically connects to the thin film transistor via the opening.

By providing the defect detection pattern, the pixel electrode can contact with the possible residue below the defect detection pattern. While testing the voltages of the pixel electrodes in a circumstance that a pixel electrode contacts the residue, the voltage measured will be affected and become abnormal, and hence the residue in the pixel structure can then be identified.

In order to disclose the advantages and merits of the present invention, a detailed description is illustrated as follows.

BRIEF DESCRIPTION OF THE DRAWINGS

FIG. 8 is a flow chart of the method for fabricating the pixel structure according to the present invention.

DESCRIPTION OF THE PREFERRED EMBODIMENT

Figure 1:
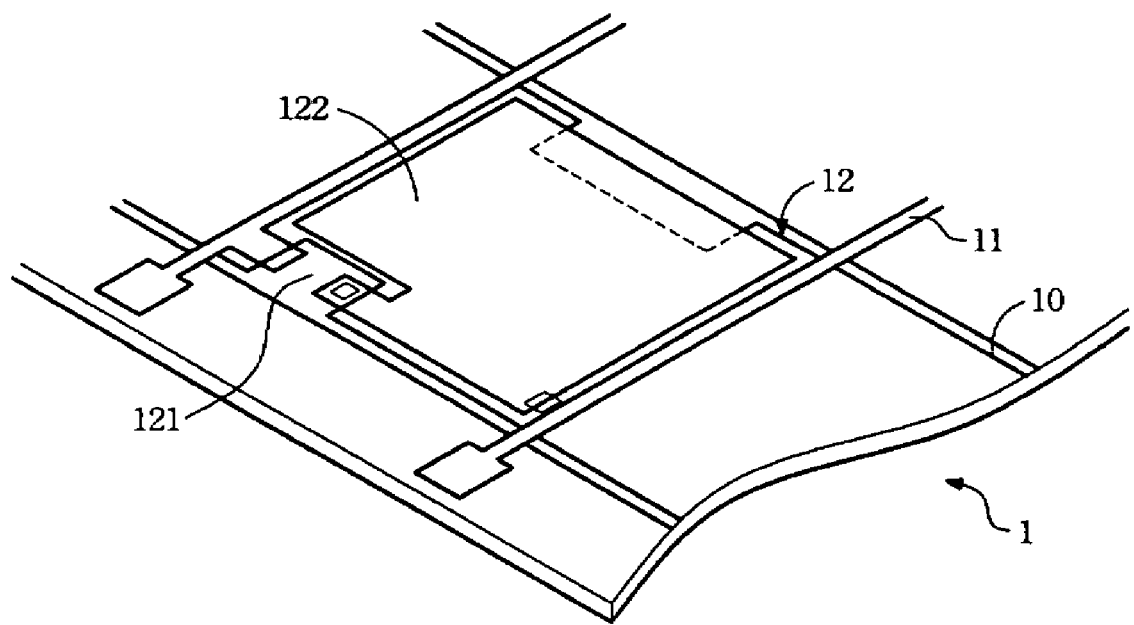
FIG. 1 is a schematic top-view of a typical array substrate in a liquid crystal display.
Figure 2:
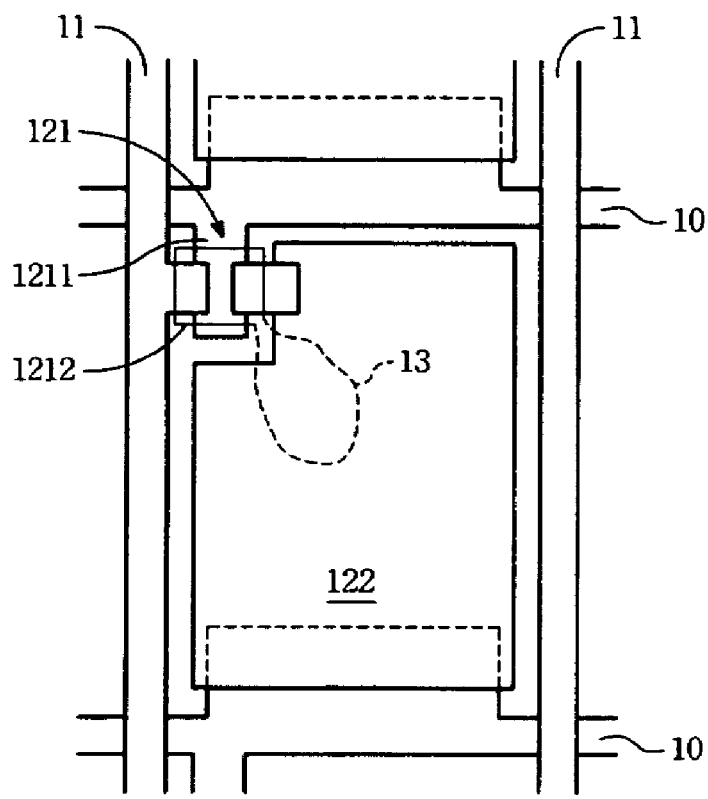
FIG. 2 is a schematic top-view of a typical pixel structure.
Figure 3:
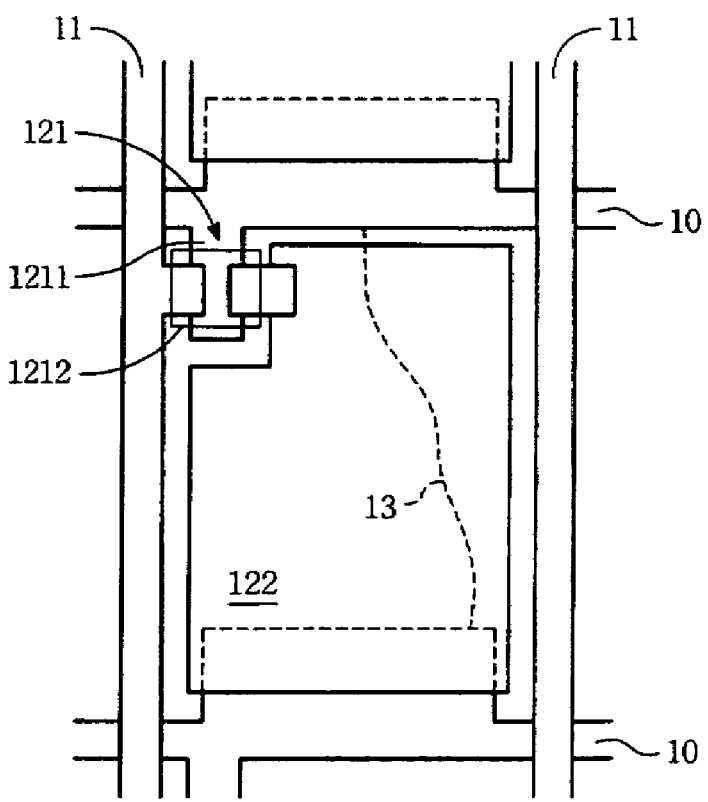
FIG. 3 is a schematic top-view of another conventional pixel structure.
Figure 4A:
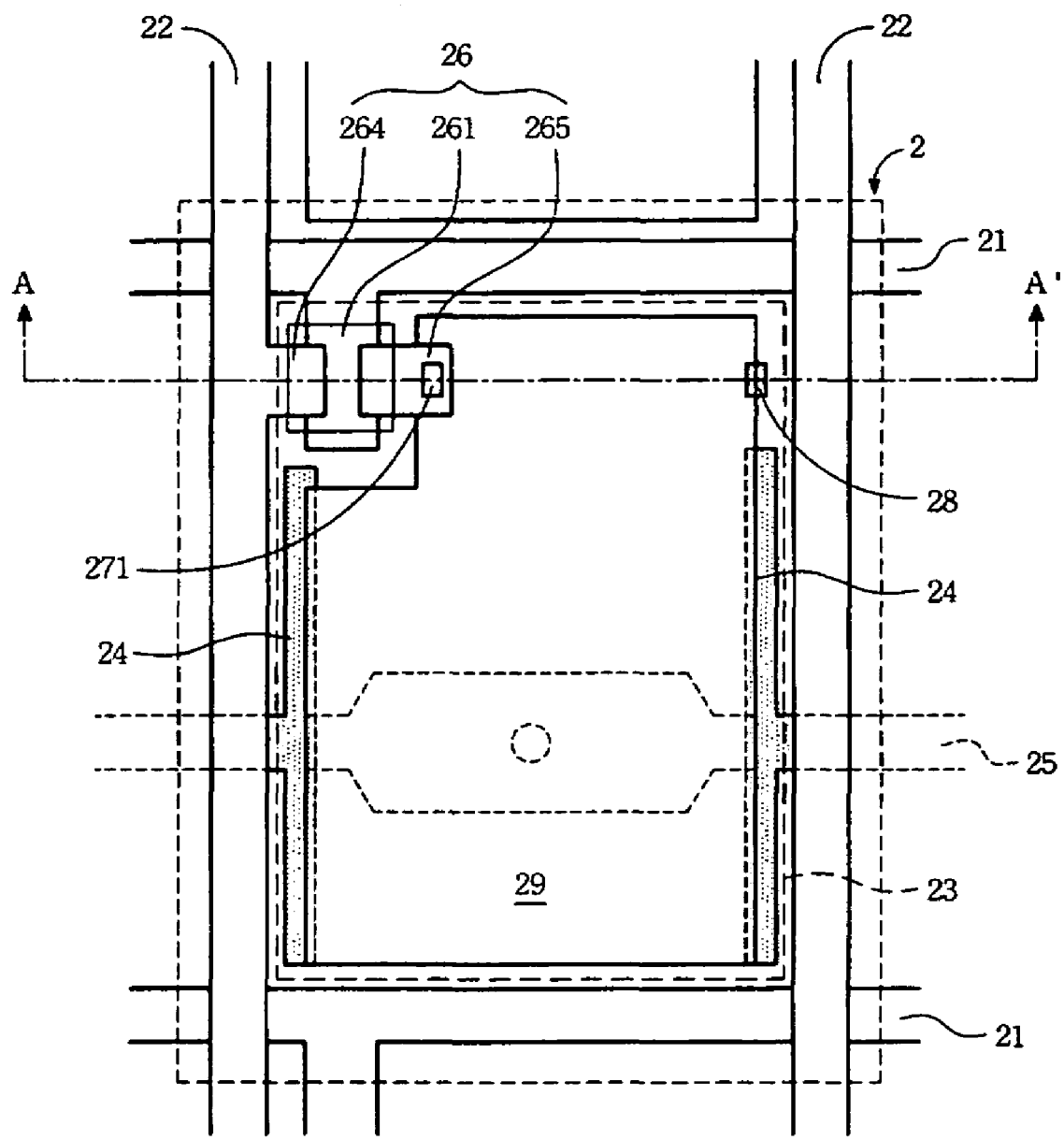
FIG. 4A is a schematic top-view of an embodiment of the pixel structure according to the present invention.
Figure 4B:
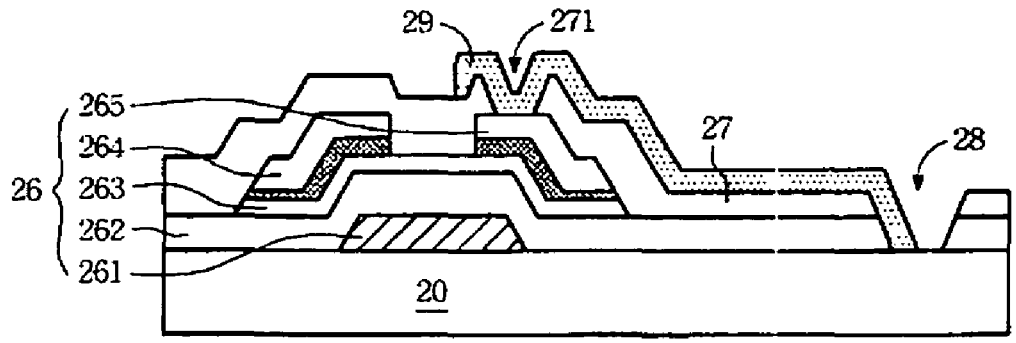
FIG. 4B is a schematic cross-section of FIG. 4A along line A-A' region.

Referring to FIG. 4A and FIG. 4B, a schematic top-view of an embodiment of the pixel structure 2 in accordance with the present invention and a cross-section view along line A-A' are shown, respectively.

As shows, a plurality of scan lines 21 and a plurality of data line 22 are disposed on a substrate 20. The scan lines 21 substantially intersect the data lines 22 to form a plurality of pixel structures 2, of which each pixel structure 2 is defined by two adjacent scan lines 21 and two adjacent data lines 22.

In other words, the pixel structure 2 of the present invention includes at least two scan lines 21 and at least two data lines 22, and the two scan lines 21 substantially intersect the two data lines 22 so as to form a region 23.

In a preferred embodiment, the pixel structure further includes at least two light shielding patterns 24 and at least one common line 25, but not limited it. The light shielding pattern 24 is overlapped at least part of the pixel electrode at a predetermined position. In the preferred embodiment of the present invention, for example, the light shielding pattern 24 is substantially parallel to the respective data lines 22 for reducing the amount of light leak occurring in the pixel structure 2. As to other embodiment, the light shielding pattern 24 may also substantially parallel to the scan lines 21. In another embodiment, the pixel structure 2 can further include three light shielding patterns 24 and at least one common line 25, in which two of the light shielding patterns 24 can substantially parallel to the data lines, respectively, the other light shielding patterns 24 can substantially parallel to one of the scan lines 21, and the common line 25 is disposed between two adjacent scan lines 22 so as to act as a storage capacitance in the pixel structure 2.

Referring also to FIG. 4B. In addition, the pixel structure 2 of the present invention can also include a thin film transistor 26, a passivation layer 27, a defect detection pattern 28, and a pixel electrode 29.

The thin film transistor 26 is disposed in the region 23. Typically in the this embodiment, a back-channel etched (BCE) structure is adapted to the thin film transistor, while, in other embodiments, an etched-stopper structure, a bottom-gate structure, an inversed-TFT structure, or a top-gate structure can also be adapted to the thin film transistor 26 of the present invention. In addition, the thin film transistor 26 can be of an N-type transistor, a P-type transistor, or any combination thereof. The material of the operative semiconductor layer of the thin film transistor structure can include poly silicon, monocrystalline silicon, micro-crystal silicon, amorphous silicon, or any combination thereof. The thin film transistor 26 is electrically connected to one of the two scan lines 22 and one of the two data lines 23.

The thin film transistor 26 comprises a gate 261, an insulating layer 262, a channel layer 263, a source 264, and a drain 265. The fabrication process of the thin film transistor 26 includes: forming a first metal layer on the surface of the substrate so as to form the scan lines 21, the light shielding pattern 24, the common lines 25, and the gate 261 of the thin film transistor 26; and covering an insulating layer 262 on the scan lines 21, the light shielding pattern 24, the common lines 25, and the gate 261 of the thin film transistor 26. The insulating layer 262 includes, for example, inorganic material (such as silicon oxide, silicon nitride, silicon oxynitride, silicon carbide, or likes), at least one organic material (such as photo-resistant, polyester, polyvinyl alcohol, or other polymer), or any combination thereof.

In addition, a semiconductor layer (such as at least one silicon layer and at least one doped silicon layer) is formed on the insulating layer 262 as the channel layer 263 of the thin film transistor 26. The material of the semiconductor comprises poly silicon, monocrystalline silicon, micro-crystal silicon, amorphous silicon, or any combination thereof. Next, a second metal layer is formed on the channel layer 263 so as to form the data lines 22, the source 264, and the drain 265 of the thin film transistor 26. Or, the first metal layer can also be formed on the surface of the substrate so as to form the scan lines 21, the common lines 25, and the gate 261 of the thin film transistor 26. Then, an insulating layer 262 is introduced to cover the scan lines 21, the common lines 25, and the gate 261 of the thin film transistor 26. Further, a semiconductor layer (such as at least one silicon layer and at least one doped silicon layer) is formed on the insulating layer 262 as a channel layer 263 of the thin film transistor 26. The second metal layer is formed above the channel layer 263 so as to form the data lines 22, the source 264 of the thin film transistor 26, the drain 265 of the thin film transistor 26, and the light shielding pattern 24.

The passivation layer 27 is formed on the substrate to cover the scan lines 21, the data lines 22, and the thin film transistor 26 so as to protect the foregoing components from being polluted or damaged. Or, the passivation layer 27 can be disposed on the substrate to cover the scan lines 21, the data lines 22, the thin film transistor 26, and the light shielding pattern 24 so as to protect these components from being polluted or damaged. In addition, the passivation layer 27 having at least one opening 271 includes, for example, inorganic material (such as silicon oxide, silicon nitride, silicon oxynitride, silicon carbide, or likes), at least one organic material (such as photo-resistant, polyester, polyvinyl alcohol, or other polymer), or combinations thereof.

The defect detection pattern 28 is disposed in the region 23 for detecting whether there exists any residue (such as the conductive material, the semiconductor material, or combinations thereof) below thereof. As shown in FIG. 4A, a hole is disposed in the region 23 and is as the defect detection pattern 28. Though the hole herein is located at the corner in the region 23 of the present embodiment of the invention, yet the present invention does not limit the place of the hole. Namely, the hole can be disposed at any position in the region 23, such as in the middle area of the region 23, at the place adjacent to the thin film transistor 26, or at any place other than the corner. Actually, as long as the function of the defect detection pattern mentioned in the embodiment of the present invention can be performed, its position is never a limitation to the embodiment of the present invention.

The pixel electrode 29 is disposed on the passivation layer 27 and electrically connected to the thin film transistor 26 via the opening 271. In particular, the gate 261 of the thin film transistor 26 is electrically connected to one of the two scan lines 21, the source 264 of the thin film transistor 26 is electrically connected to one of the two data lines 22, and the pixel electrode 29 is electrically connected to the drain 265 of the thin film transistor 26 via the opening 271. In addition, the electrode pixel 29 covers at least part of the defect detection pattern 28. In particular, the pixel electrode 29 may cover fully the defect detection pattern 28. The pixel electrode 29 includes, for example, metal (such as molybdenum, aluminum, copper, silver, chromium, aurum, titanium, tantalum, molybdenum, hafnium, neodymium, or likes), metal alloy (such as aluminum molybdenum alloy, aluminum neodymium alloy, molybdenum neodymium alloy, or likes), metal oxide (such as indium tin oxide, indium zinc oxide, cadmium tin oxide, aluminum zinc oxide, zinc oxide, or likes), metal nitride (such as titanium nitride, tantalum nitride, or likes), or any combination thereof.

Preferably, in order to inspect completely whether any residue remains on the surface of the substrate, the passivation layer 27 and the insulating layer 262 can be etched throughout before the defect detection pattern 28 is formed.

As shown in FIG. 4B, if no residue remains, after etching through the passivation layer 27 and the insulating layer 262, the defect detection pattern 28 will expose to the surface of the substrate 20 below the passivation layer 27. Subsequently, after the pixel electrode 29 is formed on the passivation layer 27, the pixel electrode 29 will extend through the defect detection pattern 28 and contact the surface of the substrate 20. Upon such an arrangement, response voltages of the pixel electrode 29 will not be affected.

Figure 4C:
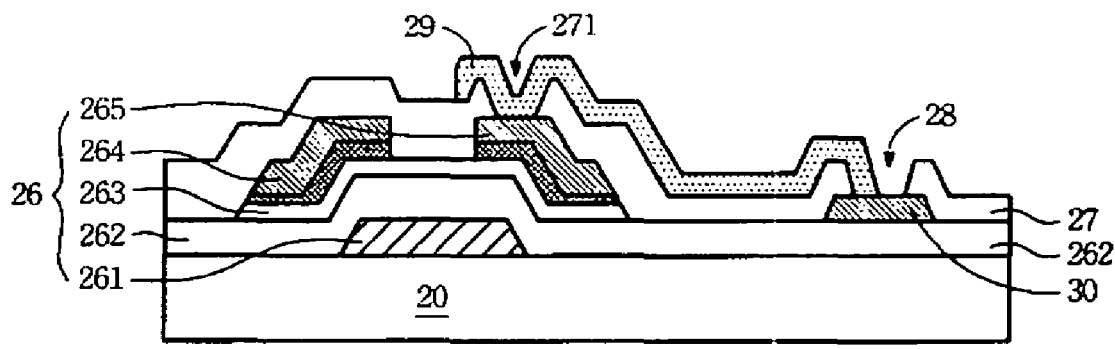
FIG. 4C is a schematic cross-section of a pixel structure where the surface of the insulating layer remains residues.

FIG. 4C shows as the state that the passivation layer 27 and the insulating layer 262 are etched, and the defect detection pattern 28 is formed. In the case that there exists the residue 30 comprising any conductive material, semiconductor material, or combinations thereof (such as the amorphous silicon residue, or the residue made of the second metal layer) on the surface of insulating layer 262 below the defect detection pattern 28, then the surface of residue 30 can be exposed after the passivation layer 27 is etched throughout. Note that the insulating layer 262 can not be etched through subsequently. When the pixel electrode 29 is formed on the passivation layer 27, it will pass through the defect detection pattern 28 to contact the above-mentioned residue 30 so as to establish an electric connection in between. When a voltage is input to the pixel structure at a state that the residue holds a different voltage different from that of the pixel electrode, or at a state that the residue generates the coupled capacitance with any structure with a distinct voltage, the pixel electrode 29 will be affected by the residue 30 and a bias in voltage will occur.

Figure 4D:
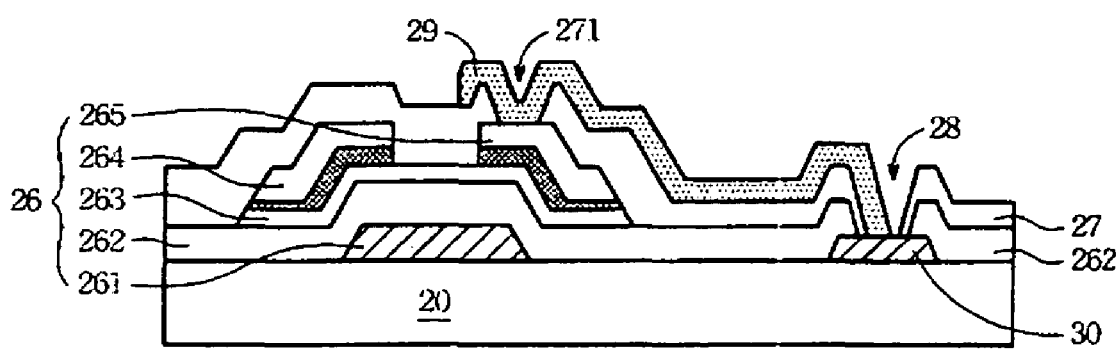
FIG. 4D is a schematic cross-section of a pixel structure where the surface of the array substrate remains residues.

As shown in FIG. 4D, in the case that the residue 30 (such as the residue comprising the first metal layer) remains on the surface of the array substrate 20 in the pixel structure, and then after the passivation layer 27 and the insulating layer 262 have been etched through, the surface of the residue 30 will be exposed on the defect detection pattern 28. While the pixel electrode 29 is formed on the passivation layer 27, it will contact the above-mentioned residue 30. If the residue 30 has a different voltage from that of the pixel electrode or forms the coupled capacitance with other structures with distinct voltages, its voltage will be affected and biased.

Of course, in other embodiments, one may merely detect the residue on the top of the insulating layer 262. That is to say that only the passivation layer 27 is etched throughout to form the defect detection pattern 28. In the case that the insulating layer 262 has thereon the residue (such as the amorphous silicon residue, or the residue comprise the second metal layer), and that the pixel electrode 29 is formed on the passivation layer, the pixel electrode 29 would contact the above-mentioned residue and its voltage would be affected.

Figure 5A:
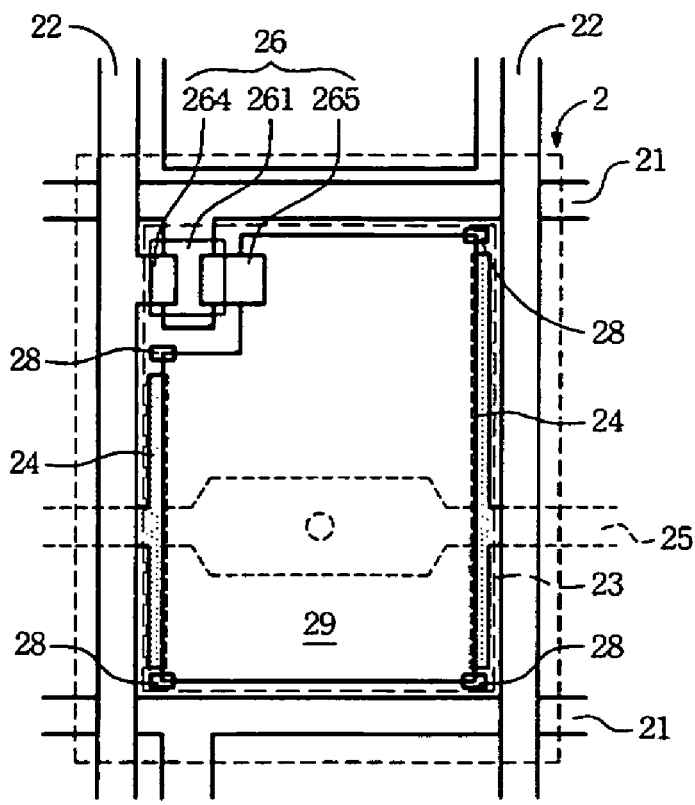
FIGS. 5A-5F illustrate various embodiments of defect detection pattern in the pixel structure of the present invention.

A further explanation is that the type and position of the defect detection pattern are determined according to the design request in the region 23. As shown in FIG. 4A, at least one hole disposed at the corner in the region is illustrated. Similarly as shown in FIG. 5A, the defect detection pattern 28 can be at least four holes disposed at two sides of the two light shielding patterns 24, respectively.

Figure 5B:
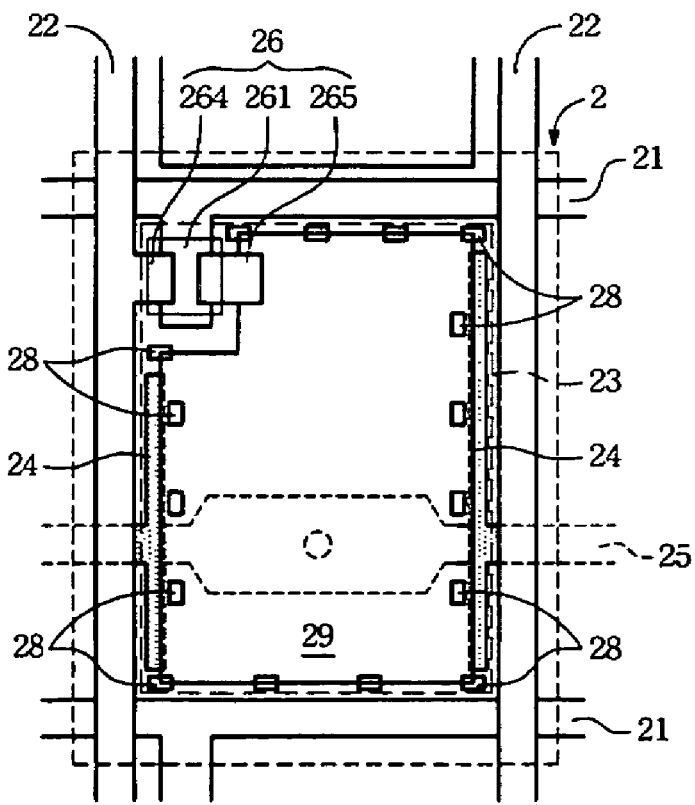

Or, as shown in FIG. 5B, the defect detection pattern 28 can be a plurality of holes substantially surrounding the region 23.

Figure 5C:
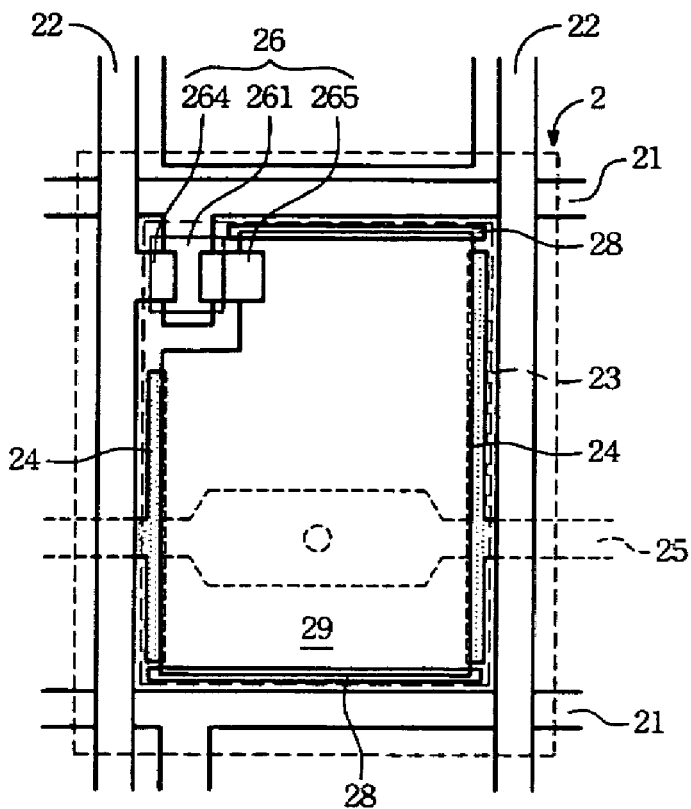

Or, as shown in FIG. 5C, the defect detection pattern 28 can be at least two counter grooves, substantially parallel and adjacent to one of scan lines 21. Of course, these two counter grooves can also be substantially parallel and adjacent to one of data lines 22.

Figure 5D:
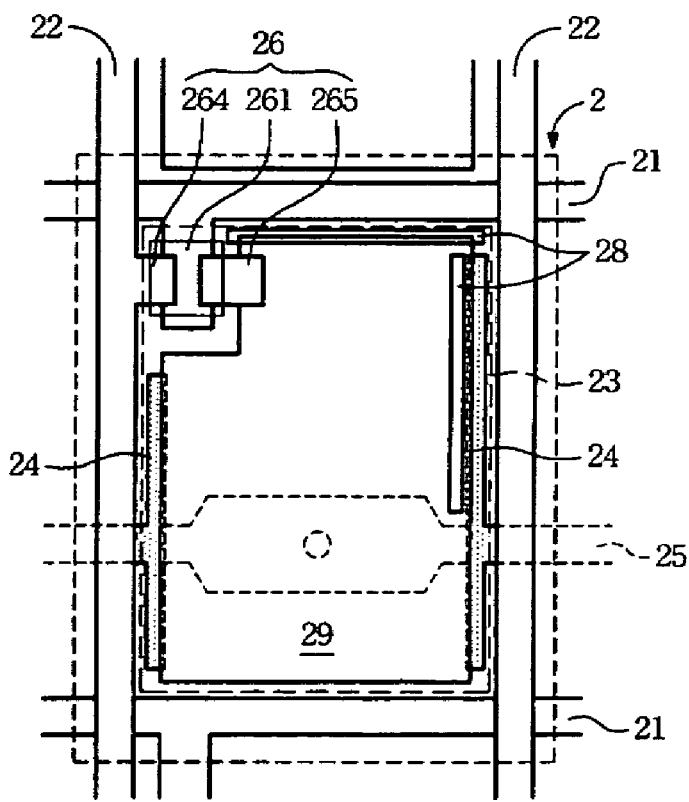

Or, as shown in FIG. 5D, the defect detection pattern 28 can be at least two counter grooves, one of the counter grooves is substantially parallel and adjacent to one of the scan lines 21 and the other of the counter grooves is substantially parallel and adjacent to one of the data lines 22.

Figure 5E:
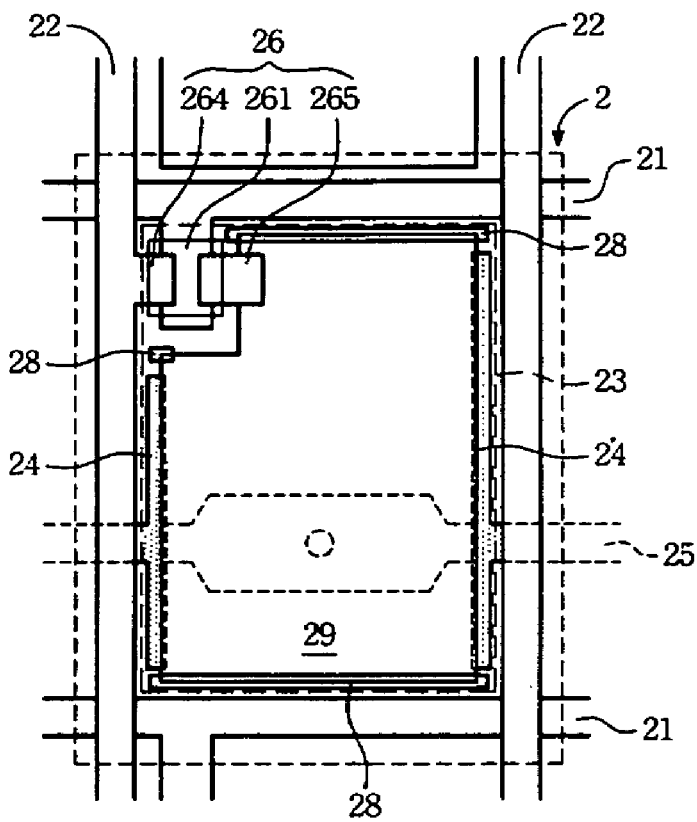

Or, as shown in FIG. 5E, the defect detection pattern 28 can be at least one hole and at least two counter grooves. The opening such as above-mentioned interpretation can be disposed at a non-corner place in the region 23 and the two counter grooves are substantially parallel and adjacent to one of the scan lines 21.

Figure 5F:
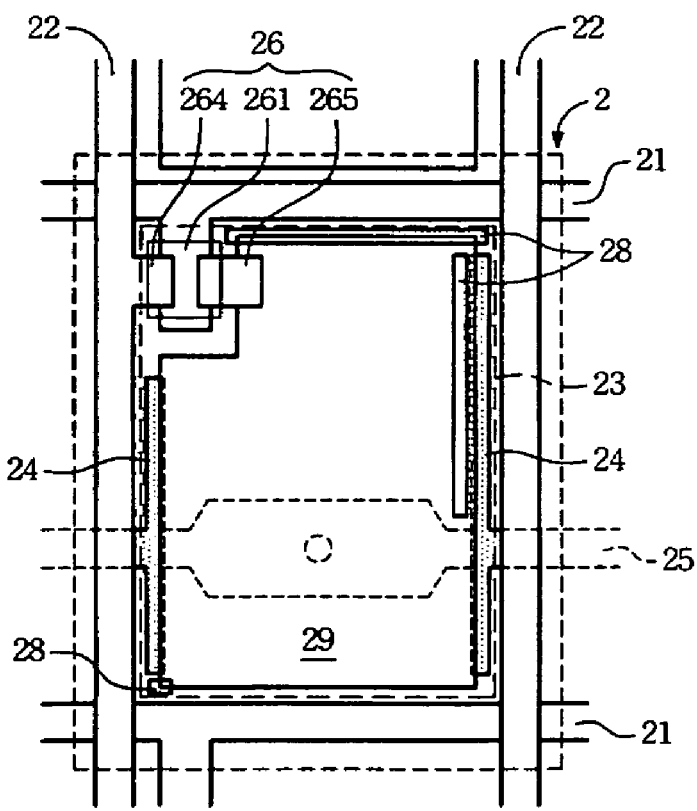

Or, as shown in FIG. 5F, the defect detection pattern 28 can be at least one hole and at least two counter grooves. The opening can be disposed at the corner in the region 23 and one of the counter grooves is substantially parallel and adjacent to one of the scan lines 21 while the other of the counter grooves is substantially parallel and adjacent to one of the data lines 22. Of course, according to the design request, the defect detection pattern 28 can only include an opening and a counter groove where the groove is substantially parallel and adjacent to the scan line 21 or the data line 22.

Figure 6:
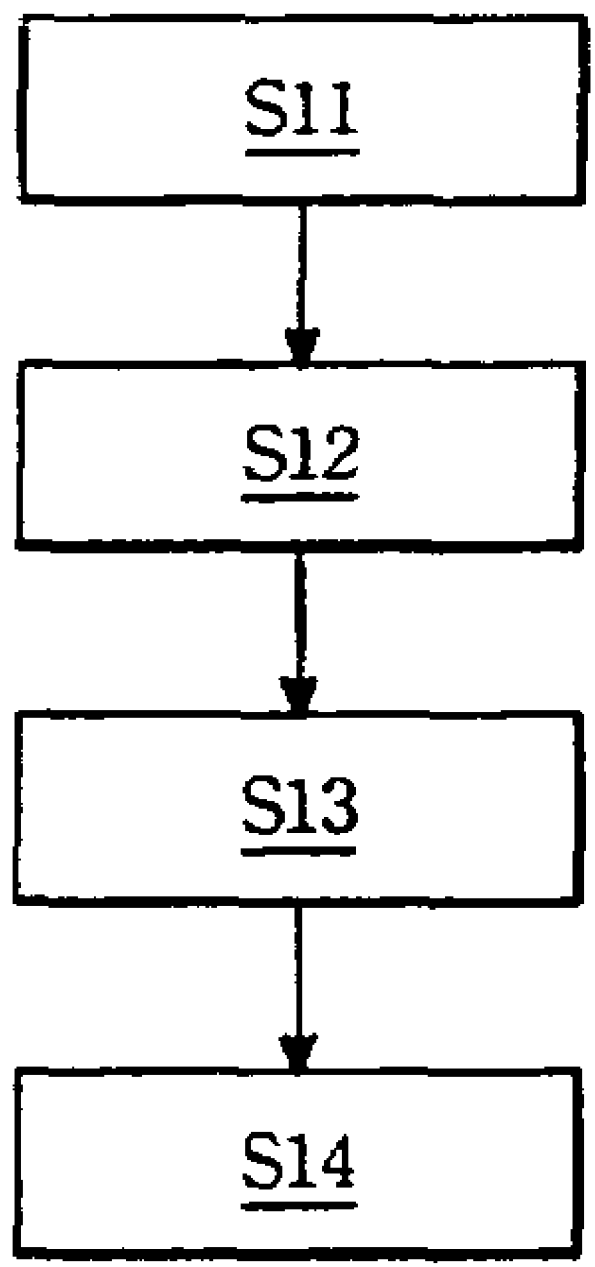
FIG. 6 is a flow chart of the method for detecting the pixel structure according to the present invention.

The design of the pixel structure can be applied to the array substrate design for various display panels, such as the liquid crystal panel, the organic electro-luminescence display panel, or the like, so as to detect whether any residue remains in the pixel structure. Moreover, the detecting and repair method for the pixel structure is also disclosed and can be performed as the steps shown in FIG. 6.

S11: Transmit a voltage to a plurality of the pixel structures. In a preferred embodiment of the present invention, the pixel structures are electrically connected to the same scan line. That is to say that the voltage is input in a proper order to each scan line on a substrate, and then the scan lines are detected one by one, but not limited it.

S12: Measure the above-mentioned pixel structures to obtain the voltages of the pixel electrodes of the pixel structures.

S13: Compare the voltages of the pixel electrodes of the pixel structures so as to locate the pixel structure with a biased voltage.

S14: Determine the pixel structure with a biased voltage where remains the conductive material, semiconductor material, or any combination thereof. As above-mentioned, if a residue comprise conductive material, semiconductor material, or combinations thereof remains below the defect detection pattern, the voltage of the pixel electrode of the pixel structure will be affected by the residue and a biased voltage will be generated while transmitting a voltage. In other word, the biased voltage represents that an abnormal voltage exists in the pixel structure with the residue, which is substantially different to the voltage for a pixel structure without the residue.

After testing an array substrate, it can be identified whether the pixel structure has the residue on the substrate. Furthermore, in order to observe the pixel structures and to locate the exact positions of the residues, a microscope, for example, can be used to observe the pixel structure, and then a laser can be introduced to cut the electrical connection between the residues and their surrounding components. Thereby, the voltage at the testing point can be returned back to a normal voltage.

Figure 7A:
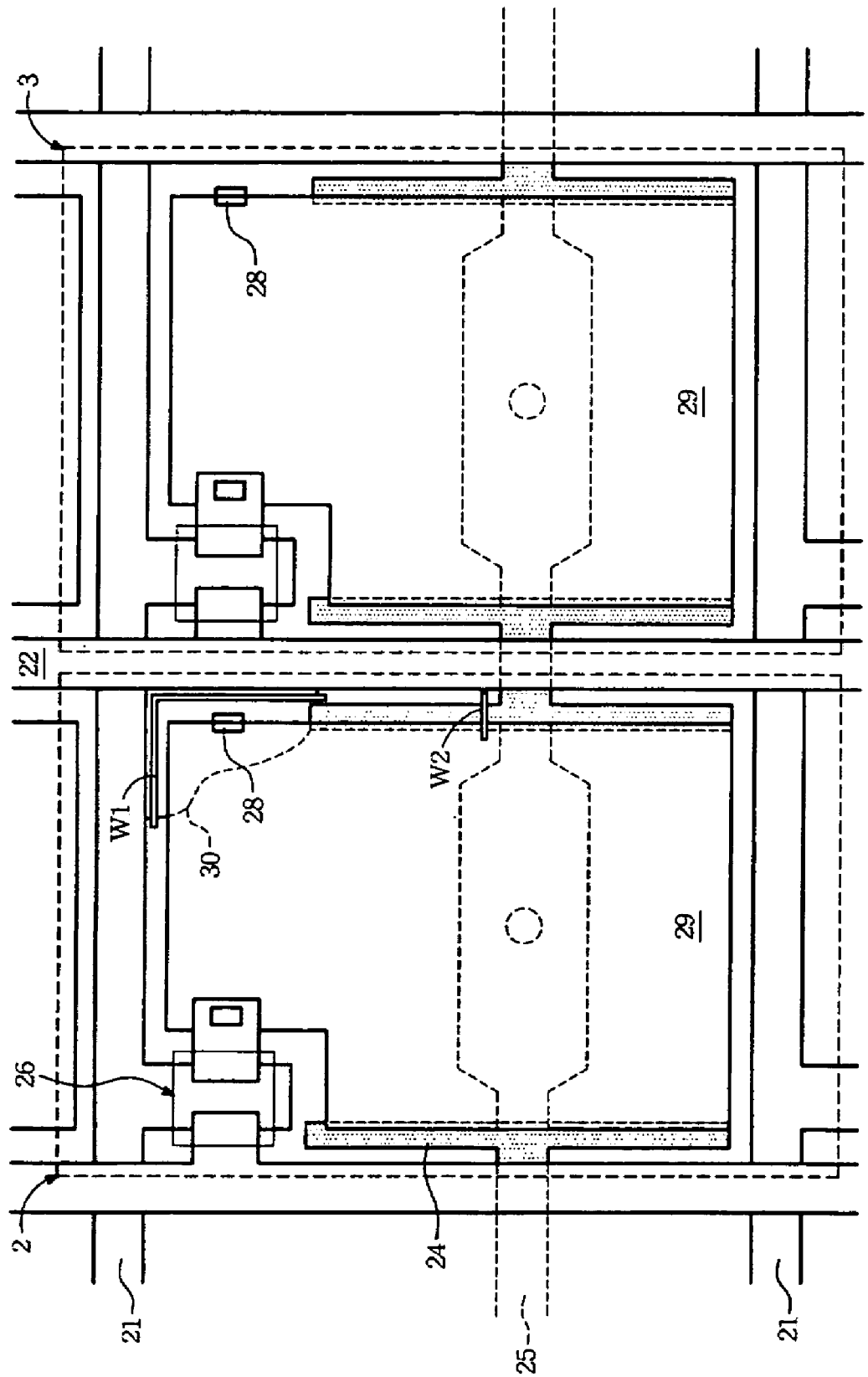
FIGS. 7A-7C are schematic views of an exemplary pixel structure of the present invention under detection and repair in which residues remain in any layer.
Figure 7B:
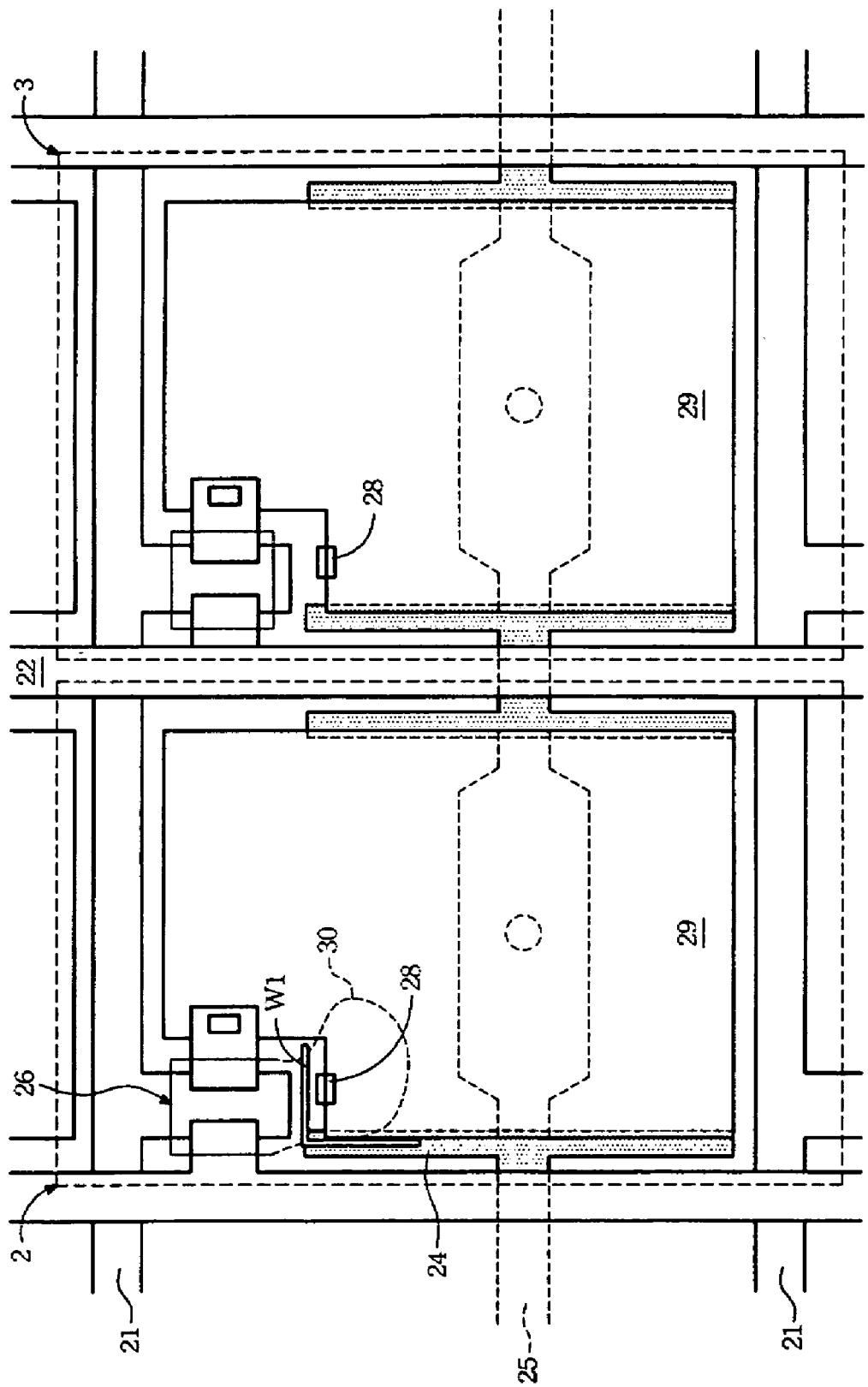
Figure 7C:
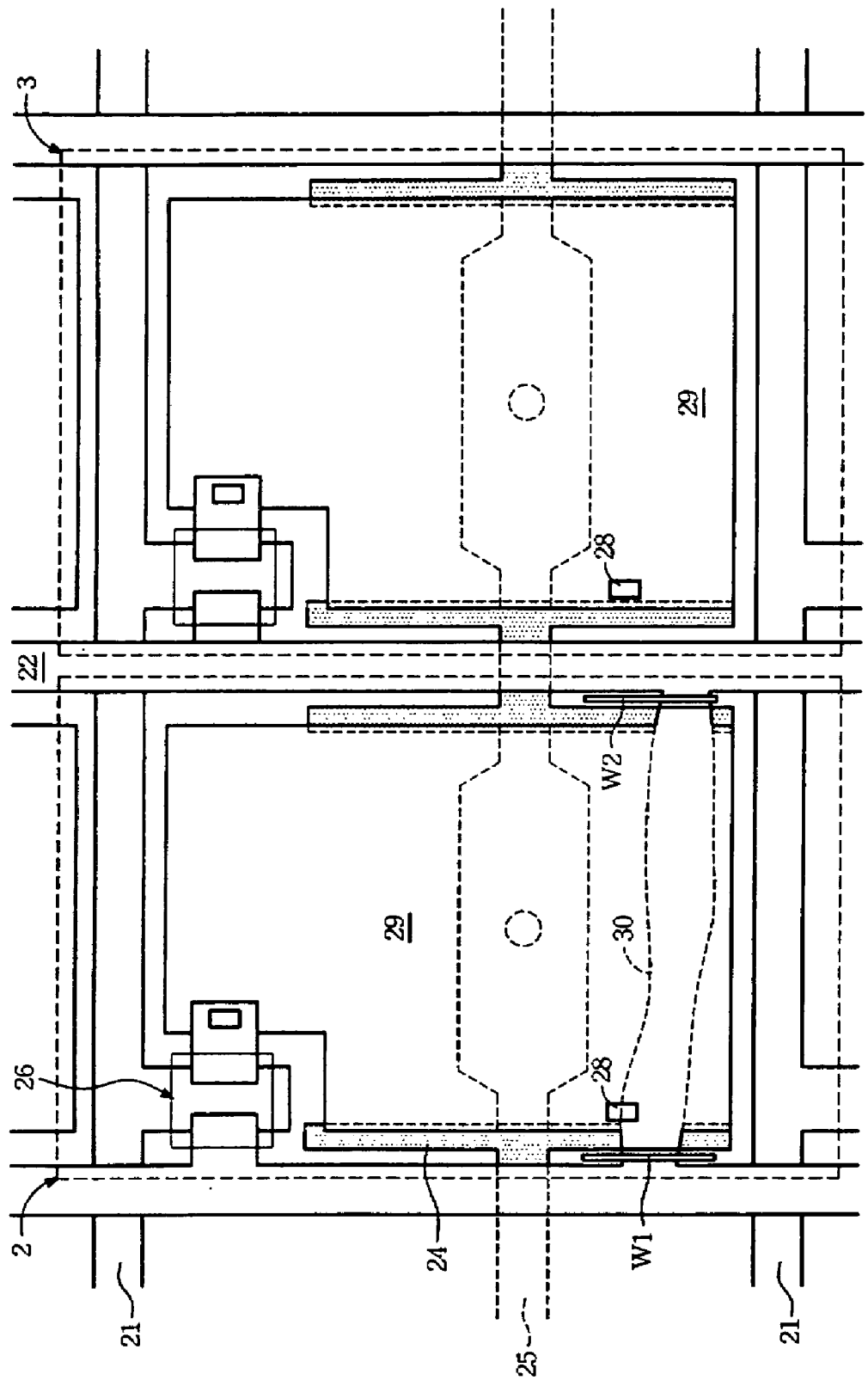

To further describe how the detecting and repair method can be applied to a situation that the residues occur at each layer in the pixel structure, refer to figures from FIG. 7A to FIG. 7C.

As shown in FIG. 7A, when the first metal layer is deposited on the substrate so as to fabricate the scan lines, the common lines, and the light shielding patterns, the residues may remain on some non-predetermined places. In the pixel structure 2, the residue 30 formed from the first metal layer is disposed between the scan line 21 and the light shielding pattern 24. This may result in a short circuit in between, and may further shortcut the scan line 21 and the common line 25.

By setting up the defect detection pattern 28 during the subsequent fabrication of depositing the pixel electrode 29, the pixel electrode 29 will cover the defect detection pattern 28 and contact the residue 30. By simultaneously transmitting the voltage to the pixel structures 2 and 3, it can then be verified that a residue exists in the pixel structure 2 if the voltage at the electrode of the pixel structure 2 is substantially less than or much less than that of the pixel structure 3. Subsequently, for observing the pixel structure 2 to further verify the exact position of the residue, a microscope can be applied to observe the pixel structure. The cut routes W1 and W2 can be formed and followed so that the connections between the residue 30, the scan line 21, and the common line 25 can be eliminated by a laser moving along the cut routes W1 and W2. Thereby, an open status can be assured to prevent the residue 30 from producing the coupled capacitance in the driving state, and any shortcut between the scan line 21 and the common line 25 can be avoided.

As shown in FIG. 7B, when depositing an amorphous silicon layer to fabricate a channel layer for the thin film transistor, the residues may remain at some non-predetermined places. As shown, in the pixel structure 2, the residue 30 comprises the amorphous silicon layer to produce the coupled capacitance.

Whereby the defect detection pattern 28 is created, the pixel electrode may contact the residue. By simultaneously transmitting the voltages to the pixel structures 2 and 3, if the voltage of the pixel electrode of the pixel structure 2 is substantially less than or much less than that of the pixel structure 3, it can be verified that some residues remain in the pixel structure 2. Subsequently, for observing the pixel structure 2 to indicate the exact position of the residue, a microscope, for example, can be used to observe the pixel structure. Preferably, the microscope comprises an infrared microscope or the like, and then the cut route W1 can be formed so as to prevent from the residue that generates the coupled capacitance. In the present invention, a laser can be used to form the cut route.

As shown in FIG. 7C, when a second metal layer is deposited for fabricating the data lines and both the source and the drain of the thin film transistor, the unnecessary residue may also remain at non-predetermined is places. As shown in the figure, in the pixel structure 2, there exists a residue 30 comprising the second metal layer. Similarly, the residue 30 may connect to the data lines and thus to produce a coupled capacitance. Or, as shown in this figure, the residue 30 may connect to two data lines 22 and to construct a short circuit.

Whereby the defect detection pattern 28 is created, similarly, this may lead to the pixel electrode to contact the residue. By simultaneously transmitting a voltage to the pixel structures 2 and 3, if the voltage of the pixel electrode of the pixel structure 2 is substantially less than or much less than that of the pixel structure 3, it is then verified accordingly that there is a residue remained in the pixel structure 2. Subsequently, examining the pixel structure 2 can also be performed to verify the exact position of the residue. A microscope can be used to examine the pixel structure, and then the cut route W1 and W2 can further be formed to eliminate the connection between the residue 30 and the data line 22. A laser, for example, can be used to form the cut route. Thereby, an open status can be assured to prevent the residue 30 from producing the coupled capacitance in the driving state, and any shortcut between two data lines 22 can be avoided.

In addition, the present invention herein can also disclose the fabrication method of the above-mentioned pixel structure as the steps shown in FIG. 8. The method comprises the steps of:

S21: forming at least two scan lines on a substrate;

S22: forming at least two data lines on the substrate, wherein the data lines substantially intersect the scan lines to form at least one region;

S23: forming at least one thin film transistor in the region, wherein the transistor electrically connects to one of the scan lines and one of the data lines;

S24: forming at least one passivation layer on the substrate, wherein the passivation layer covers the scan lines, the data lines, and the thin film transistor and having at least one opening thereof;

S25: forming at least one defect detection pattern in the region, wherein the defect detection pattern is used for inspecting whether any residue (such as conductive material, semiconductor material, or combinations thereof) remains therebelow; and S26: forming at least one pixel electrode on the passivation layer, wherein the electrode electrically connects to the thin film transistor via the opening.

In summary, the pixel structure provided by the present invention can employ the defect detection pattern to make its pixel electrode contact with possible residue, and the way of measuring biased voltages at pixel structures can be used to verify the positions on the substrate so that repairing works can be performed onto those abnormal pixel structures The above-description is a detailed illustration for a variety of preferred embodiments of the present invention. The embodiments should not be construed as limiting the scope of the invention. Rather, it is intended to cover various modifications and similar arrangements included within the spirit and scope of the appended claims, the scope of which should be accorded the broadest interpretation so as to encompass all such modifications and similar structure.

What is claimed is:

1. A plurality of pixel structures arranged in an array substrate, each pixel structure comprising:
   at least two scan lines formed on a substrate;
   at least two data lines formed on the substrate and substantially intersecting the at least two scan lines, respectively, so as to form at least one region;
   at least one thin film transistor disposed in the at least one region and electrically connected to one of the at least two scan lines and one of the at least two data lines;
   at least one passivation layer disposed on the substrate and covering the at least one region, the at least two data lines, and the at least one thin film transistor, and having at least one opening;
   at least one defect detection pattern disposed in the at least one region and penetrating through the at least one passivation layer to expose the substrate, wherein the at least one defect detection pattern includes at least one hole or at least one groove; and
   at least one pixel electrode disposed on the at least one passivation layer and electrically connected to the at least one thin film transistor via the at least one opening, and extending to the substrate via the at least one defect detection pattern, wherein, at least one of the plurality of the pixel structures comprises a residue remained between the at least one passivation layer and the substrate and exposed in the at least one defect detection pattern, the at least one pixel electrode contacts with the residue via the at least one defect detection pattern.

2. The plurality of pixel structures of claim 1, wherein the at least one thin film transistor comprises a gate, at least one insulating layer, a channel layer, a source, and a drain, and wherein the gate is electrically connected to one of the at least two scan lines, the source is electrically connected to one of the at least two data lines, and the drain is electrically connected to the at least one pixel electrode via the at least one opening.

3. The plurality of pixel structures of claim 1, wherein the at least one pixel electrode covers at least part of the at least one defect detection pattern.

4. The plurality of pixel structures of claim 1, further comprising at least two light shielding patterns disposed in the at least one region.

5. The plurality of pixel structures of claim 4, wherein the at least one defect detection pattern comprises a plurality of holes disposed at two sides of each of the at least two light shielding patterns.

6. The plurality of pixel structures of claim 1, wherein the at least one defect detection pattern comprises a plurality of holes disposed in the at least one region.

7. The plurality of pixel structures of claim 1, wherein the at least one defect detection pattern comprises a plurality of holes surrounding the at least one region.

8. The plurality of pixel structures of claim 1, wherein the at least one defect detection pattern comprises at least two longitudinal grooves substantially parallel and adjacent to at least one of the at least two scan lines and the at least two data lines.

9. The plurality of pixel structures of claim 1, wherein the at least one defect detection pattern comprises at least two longitudinal grooves, one of the at least two longitudinal grooves is substantially parallel and adjacent to one of the at least two scan lines, and another one of the at least two longitudinal grooves is substantially parallel and adjacent to one of the at least two data lines.

10. The plurality of pixel structures of claim 1, wherein the at least one defect detection pattern comprises at least one hole and at least one longitudinal groove, wherein the at least one hole is disposed in the at least one region, and the at least one longitudinal groove is substantially parallel and adjacent to one of the at least two scan lines or the at least two data lines.

11. The plurality of pixel structures of claim 1, further comprising a common line disposed between the at least two scan lines.

12. A method for detecting the plurality of pixel structures of claim 1, comprising:
   transmitting a voltage to the plurality of pixel structures;
   measuring a response voltage of the at least one pixel electrode of each of the plurality of pixel structures; and
   comparing the response voltages measured to identify one or more of the plurality of pixel structures with an abnormal response voltage as a result of the residue, wherein the abnormal response voltage is substantially different from the response voltage.

13. The method of claim 12, wherein the plurality of pixel structures are electrically connected to one of the at least two scan lines.

14. The method of claim 12, further comprising locating the one or more of the plurality of pixel structures with the abnormal response voltage to verify an exact location of the residue.

15. The method of claim 14, further comprising cutting electrical connection between the residue and surrounding components thereof.

16. The method of claim 14, further comprising cutting electrical connection between the residue and one of the at least two scan lines.

17. The method of claim 14, further comprising cutting electrical connection between the residue and one of the at least two data lines.

18. A method for manufacturing a plurality of pixel structures arranged in an array substrate, each pixel structure manufacturing comprising:
   forming at least two scan lines on a substrate;
   forming at least two data lines on the substrate and substantially intersecting to the at least two scan lines so as to form at least one region;
   forming at least one thin film transistor in the at least one region and electrically connected to one of the at least two scan lines and one of the at least two data lines;
   forming at least one passivation layer on the substrate, so that the at least one passivation layer has at least one opening to expose a drain of the at least one thin film transistor and covers the at least one region, the at least two data lines, and the at least one thin film transistor;
   forming at least one defect detection pattern in the at least one region and penetrating through the at least one passivation layer to expose the substrate, wherein the at least one defect detection pattern includes at least one hole or at least one groove; and
   forming at least one pixel electrode on the at least one at least one passivation layer, the at least one pixel electrode connecting electrically to the at least one thin film transistor via the at least one opening and extending to the substrate via the at least one defect detection pattern, wherein, at least one of the plurality of the pixel structures comprises a residue remained between the at least one passivation layer and the substrate and exposed in the at least one defect detection pattern, the at least one pixel electrode contacts with the residue via the at least one defect detection pattern.

19. The method of claim 18, wherein the at least one thin film transistor comprises a gate, at least one insulating layer, a channel layer, a source, and the drain, wherein the gate is electrically connected to one of the at least two scan lines, the source is electrically connected to one of the at least two data lines, and the drain is electrically connected to the at least one pixel electrode.

20. The method of claim 18, wherein the at least one pixel electrode covers at least part of the at least one defect detection pattern.

21. The method of claim 18, further comprising forming at least two light shielding patterns in the at least one region.

22. The method of claim 21, wherein the at least one defect detection pattern comprises a plurality of holes disposed at two sides of each of the at least two light shielding patterns.

23. The method of claim 18, wherein the at least one defect detection pattern comprises a plurality of holes disposed in the at least one region.

24. The method of claim 18, wherein the at least one defect detection pattern comprises a plurality of holes surrounding the at least one region.

25. The method of claim 18, wherein the at least one defect detection pattern comprises at least two longitudinal grooves substantially parallel and adjacent to at least one of the at least two scan lines and the at least two data lines.

26. The method of claim 18, wherein the at least one defect detection pattern comprises at least two longitudinal grooves, one of the at least two longitudinal grooves is substantially parallel and adjacent to one of the at least two scan lines, and another one of the at least two longitudinal grooves is substantially parallel and adjacent to one of the at least two data lines.

27. The method of claim 18, wherein the at least one defect detection pattern comprises at least one hole and at least one longitudinal groove, wherein the at least one hole is disposed in the at least one region, and the at least one longitudinal groove is substantially parallel and adjacent to one of the at least two scan lines or the at least two data lines.

28. The method of claim 18, further comprising forming a common line between two of the at least two scan lines.

* * * * *